United States Patent [19]

Lim

[11] Patent Number: 5,478,769
[45] Date of Patent: Dec. 26, 1995

[54] PROCESS FOR FABRICATING A STASHED CAPACITOR IN A SEMICONDUCTOR DEVICE

[75] Inventor: Chan Lim, Kyoungki-do, Rep. of Korea

[73] Assignee: Hyundai Electronics Industries Co., Ltd., Rep. of Korea

[21] Appl. No.: 365,345

[22] Filed: Dec. 28, 1994

[30] Foreign Application Priority Data

Dec. 28, 1993 [KR] Rep. of Korea ............... 93-30478

[51] Int. Cl.⁶ .................... H01L 21/70; H01L 27/00
[52] U.S. Cl. ................ 437/52; 437/60; 437/919
[58] Field of Search .................. 437/47–48, 52, 437/919

[56] References Cited

U.S. PATENT DOCUMENTS 5,053,351  10/1991  Fazan et al. ............... 437/52
5,281,549  1/1994   Fazan et al. ............... 437/52

Primary Examiner—Olik Chaudhuri
Assistant Examiner—H. Jey Tsai
Attorney, Agent, or Firm—Merchant, Gould, Smith, Edell, Welter & Schmidt

[57] ABSTRACT

There is a process for fabricating a capacitor of a semiconductor device, distinguished by characteristic steps consisting broadly of laminating an impurity-doped amorphous layer and a pure amorphous layer, alternately and in at least two folds, annealing the multiplicate amorphous layer to polycrystallize it and to diffuse the impurities, utilizing an oxide pattern and a nitride spacer formed at the sidewall of the oxide pattern to form a cylindrical storage electrode consisting of the resulting polysilicon layers, and taking advantage of etch selectivity difference between the doped and undoped polysilicon layers to form grooves in the cylindrical storage electrode. Such storage electrode has a larger surface area than conventional storage electrodes do, in the same space occupied. Therefore, the fabrication process brings about effects that the high integration of semiconductor device can be accomplished and the reliability of device operation can be improved.

9 Claims, 4 Drawing Sheets

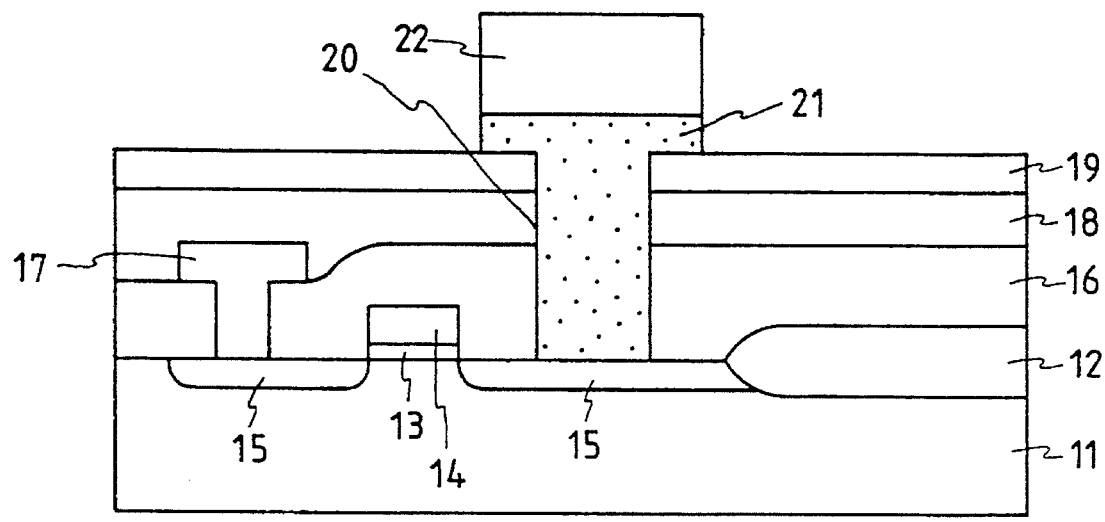
Fig. 1 (A) PRIOR ART
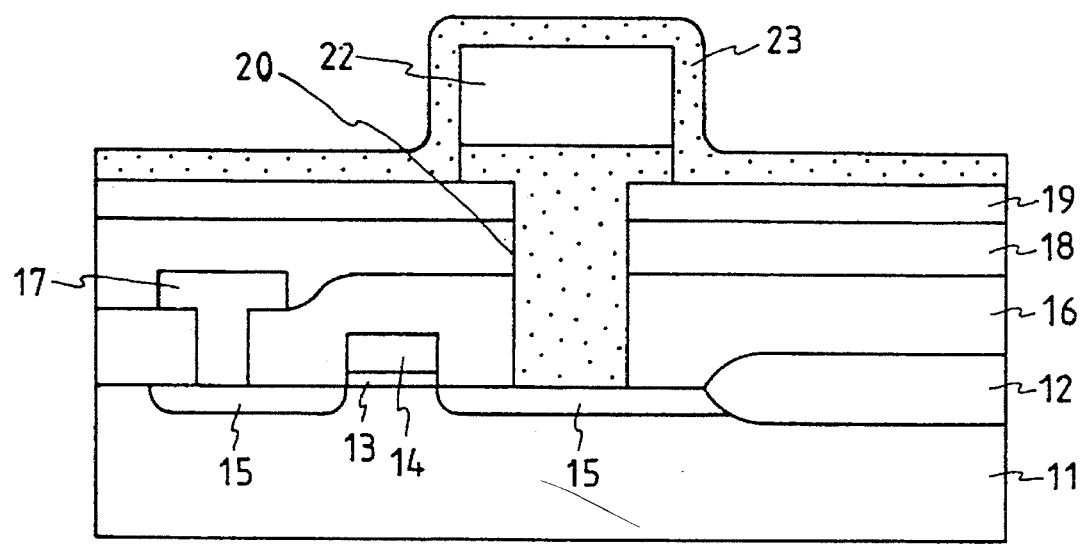
Fig. 1 (B) PRIOR ART 5,478,769

PROCESS FOR FABRICATING A STASHED CAPACITOR IN A SEMICONDUCTOR DEVICE

BACKGROUND OF THE INVENTION

1. Field of the invention

The present invention relates, in general, to a process for fabricating a capacitor in a semiconductor device and, more particularly, to increase of the capacitance per unit area of a cylindrical capacitor through employment of doped amorphous silicon layer and undoped amorphous silicon layer as materials for the capacitor and utilization of an etch selectivity difference therebetween.

2. Description of the Prior Art

Recent trend of high integration of semiconductor devices, especially DRAM devices, has been based on the diminution of cells, which leads to difficulty in providing a capacitor with sufficient capacitance.

A DRAM device, consisting of one MOS transistor and one capacitor, comprises a semiconductor substrate on which a plurality of spaced gates, that is, word lines, and a plurality of spaced metal wires, that is, bit lines are aligned perpendicular to each other in broadwise and lengthwise directions and one capacitor having a contact hole in its center is formed per two gates, extending thereacross.

In such capacitor, a conductor is made mainly of polysilicon and a dielectric material is selected from a group consisting broadly of an oxide, a nitride and an oxide-nitride-oxide (ONO) laminator. In general, a capacitor occupies much area in semiconductor chip. Accordingly, it is one of the most important factors for high integration of DRAM device to reduce the size of the capacitor yet to augment the capacitance thereof.

The capacitance of capacitor is represented by the following equation I:

$$C = (\epsilon_o \times \epsilon_r \times A)/T \quad I$$

wherein C means the capacitance of capacitor, $\epsilon_o$ is permitivity of vacuum, $\epsilon_r$ is dielectric constant of dielectric layer, A means the surface area of capacitor, and T means the thickness of dielectric layer.

As taught in Equation I, the capacitance of capacitor is determined by the permitivity of vacuum, the dielectric constant, the area of capacitor and the thickness of dielectric layer. That is, the capacitance can be increased by employing dielectric materials with high dielectric constants, making the dielectric layer thin, and/or increasing the surface area of capacitor.

However, these methods have their own problems in applying for practical semiconductor device. For example, a dielectric material with a high dielectric constant, such as $Ta_2O_5$, $TiO_2$ or $SrTiO_3$, has been extensively studied but is scarcely applied to a semiconductor device in practice because of uncertainty in its reliability and thin film characteristics, such as dielectric breakdown voltage. In the meanwhile, an extreme reduction in the thickness of the dielectric layer may be a potent factor causing a breakdown in the dielectric layer when operating the device, deleteriously affecting the reliability of the capacitor.

With regard to increase of the surface area, the capacitor is fabricated in the form of pin structure, cylindrical structure or cylindrical structure with a cross section of rectangular frame, wherein a multiplicity of polysilicon layers are so deposited as to connect them with one another. Separately, so-called hemispherical grain polysilicon (hereinafter referred to as "HSG") process was developed in order to increase the surface area of the capacitor. However, those prior techniques for increasing of the surface area cannot secure the capacitance sufficient enough to satisfy the recent trend of high integration of DRAM devices.

In order to better understand the background of the present invention, reference is made to FIG. 1 which shows the process steps for fabricating a conventional cylindrical capacitor. These steps will be generally described in connection with FIGS. 1A through 1C.

With initial reference to FIG. 1A, there are illustrated process steps just before providing the capacitor with a cylindrical shape. For this, first, on a semiconductor substrate 11, a field oxide film 12 for the device isolation, a gate oxide layer 13, a gate electrode 14 and a source/drain region 15 are formed. Then, an interlayer insulation film 16 is formed entirely over the resulting structure. Next, the interlayer insulation film 16 is removed at an area to be predetermined as bit line contact, followed by formation of a bit line 17. On the entire surface of the resulting structure are in sequence formed a planarization layer 18 made of borophosphosilicate glass (hereinafter referred to as "BPSG") and an oxide layer 19. Thereafter, the oxide layer 19, the planarization layer 18 and the interlayer insulation film 16 are in sequence removed at an area to be predetermined as storage electrode contact, so as to form a storage electrode contact hole 20. A first polysilicon layer is deposited so thickly as to fill the contact hole 20, followed by formation of a thick oxide pattern 22 on the polysilicon of the contact hole 20. Using the thick oxide pattern 22 as a mask, the first polysilicon layer is etched, to form a first polysilicon pattern 21.

Next, as shown in FIG. 1B, the resulting structure of FIG. 1A is entirely covered with a second polysilicon layer 23.

Finally, as shown in FIG. 1C, the polysilicon layer 23 is subjected to anisotropic etch to form a polyspacer 24 at the side wall of the oxide pattern 22, followed by removal of the oxide pattern 22 and the oxide layer 19. As a result, there is formed a cylindrical storage electrode 25 consisting of the polysilicon pattern 21 and the polyspacer 24.

As previously mentioned, such conventional cylindrical storage electrode cannot secure capacitance sufficient enough to meet the requirement of highly integrated devices such as those of 64M or 254M DRAM scale.

SUMMARY OF THE INVENTION

Therefore, an object of the present invention is to overcome the above problems encountered in prior arts and to provide a process for fabricating a capacitor in a semiconductor device, capable of increasing the capacitance per unit area of the capacitor and thus, improving the degree of integration of the semiconductor device and the reliability of device operation through employment of doped amorphous silicon layer and undoped amorphous silicon layer as materials for the capacitor and utilization of etch selectivity difference therebetween.

Based on intensive and thorough research and study by the present inventors, the above object of the present invention could be accomplished by a provision in a process for fabricating a capacitor of a semiconductor device, comprising the steps of: forming a MOS transistor on a semiconductor substrate; forming an insulation layer fox planarization over the entire surface of the resulting structure;

forming an oxide layer on the insulation layer for planarization; forming a contact hole, to expose a source of the transistor therethrough; forming a doped first amorphous silicon layer over the entire surface of the resulting structure, to contact the doped first amorphous silicon layer with the source; forming an undoped second amorphous silicon layer, a doped third amorphous silicon layer, an undoped fourth amorphous silicon layer, a doped fifth amorphous silicon layer, and an undoped sixth amorphous silicon layer on the doped first amorphous silicon layer, in sequence; annealing the first through the sixth amorphous silicon layers, to polycrystallize them into a first through a sixth polysilicon layers, respectively; forming an insulation layer pattern on the sixth polysilicon layer such that the insulation layer pattern overlaps with the contact hole; forming a spacer at a sidewall of the insulation layer pattern; etching the sixth through the third polysilicon layers with the spacer and insulation layer pattern serving as a mask; eliminating the insulation layer pattern; etching the sixth through the second polysilicon layers in the inside of the spacer and the second and the first polysilicon layers in the outside of the spacer, at the same time, to form a cylindrical storage electrode with the spacer serving as a mask; removing the spacer; etching the doped first, third and fifth polysilicon layers of the storage electrode to a certain thickness with a chemical etchant, to form grooves in the sidewall of the storage electrode, whereby the surface area of the storage electrode can be increased.

BRIEF DESCRIPTION OF THE DRAWINGS

The above object and other advantages of the present invention will become more apparent by describing in detail the preferred embodiments of the present invention with reference to the attached drawings in which:

FIGS. 1A through 1C are schematic cross sectional views illustrating a conventional process for fabricating a capacitor in a semiconductor device.

DETAILED DESCRIPTION OF THE PREFERRED EMBODIMENTS

Figure 1C:
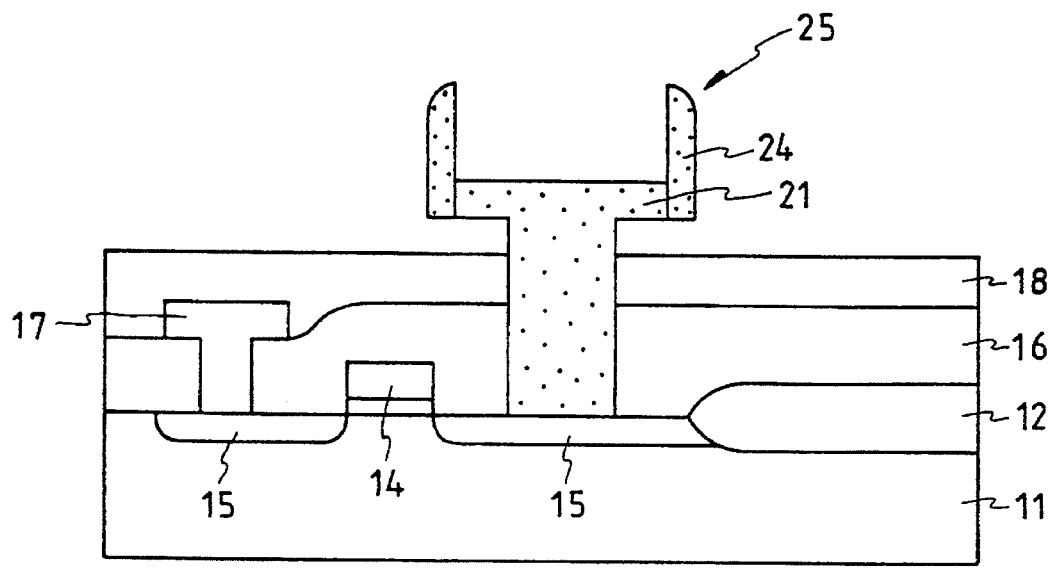

The preferred embodiments of the present invention are best understood with reference to the accompanying drawings, wherein like reference numerals are used for like and corresponding parts, respectively.

FIG. 2 shows the preferred process steps for fabricating a capacitor in a semiconductor device. These preferred process steps will be in detail described in connection with FIGS. 2A through 2E.

Figure 2A:
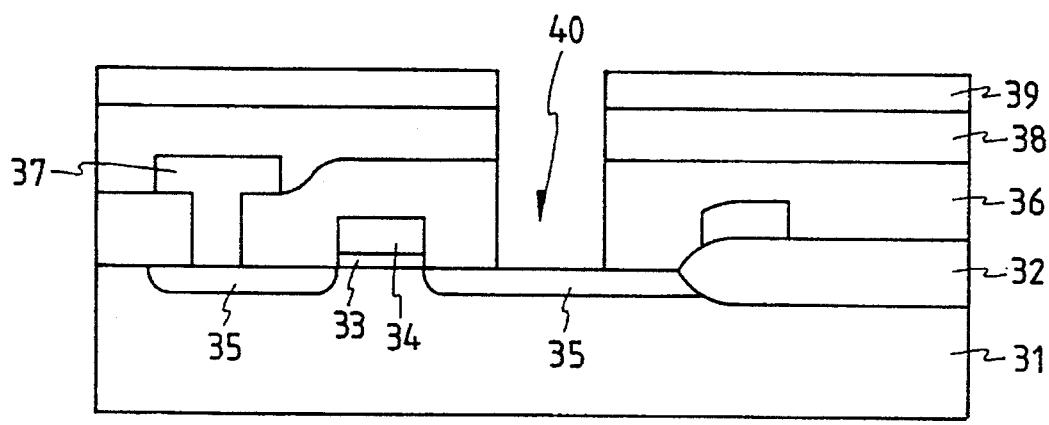
FIGS. 2A through 2E are schematic cross sectional views illustrating a process for fabricating a capacitor in a semiconductor device, according to the present invention.

First, with reference to FIG. 2A, there is illustrated a procedure for forming contact hole. On a semiconductor substrate 31, there is formed a MOSFET (metal oxide silicon field effect transistor) structure consisting of a field oxide layer 32 for device isolation, a gate oxide layer 33, a gate electrode 34 and a source/drain region 35. Then, an interlayer insulation film 36 of oxide is formed entirely over the resulting structure. Next, the interlayer insulation film 36 is taken off at an area to be predetermined as bit line contact with the source/drain region 35, followed by formation of a bit line 37 filling the contact. On the entire surface of the resulting structure are in sequence formed a planarization layer 38 made of BPSG and an undoped oxide layer 39. Thereafter, photolithography is conducted to take, in sequence, off the oxide layer 39, the planarization layer 38 and the interlayer insulation film 36 at an area to be predetermined as storage electrode contact with the source/drain region 35, with the aim of forming a storage electrode contact hole 40.

Figure 2B:
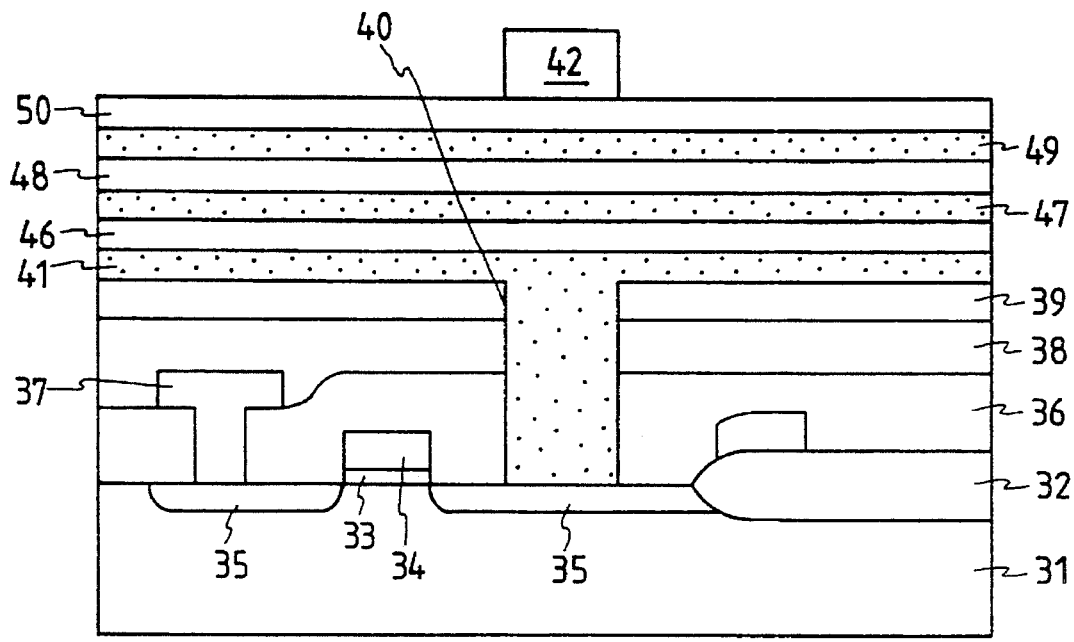
Figure 2C:
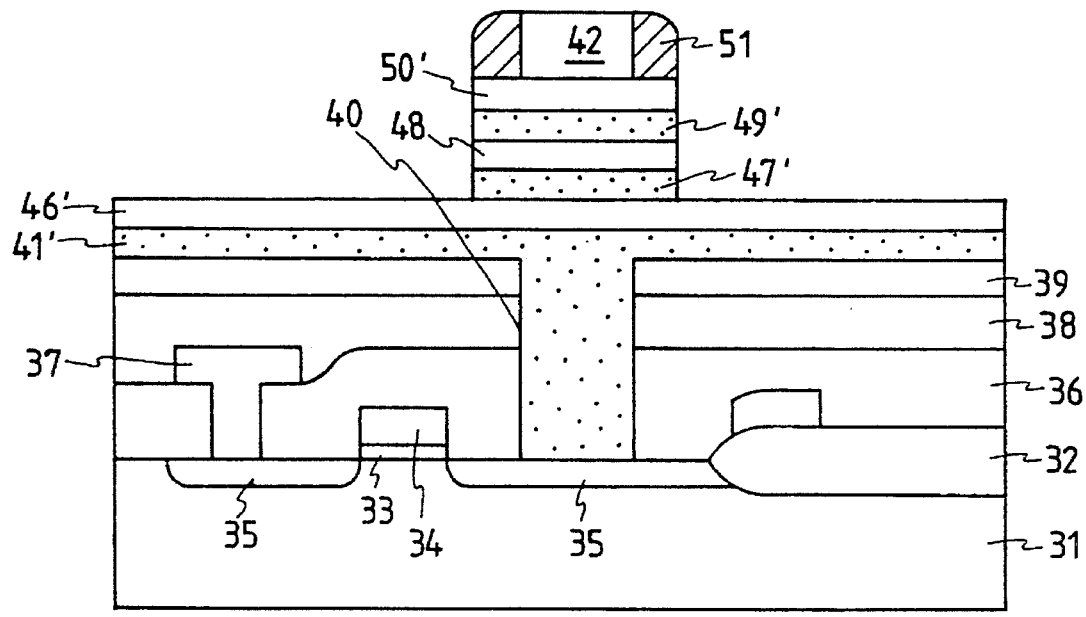

Second, with reference to FIG. 2B, a first amorphous silicon layer 41 is deposited so thickly as to fill the contact hole 40, followed by formation of a second through a sixth amorphous silicon layers 46, 47, 48, 49, 50, in due order. It is preferred that the first, the third and the fifth amorphous silicon layers 41, 47, 49 are made of amorphous silicon doped with impurity, such as boron or phosphorous, whereas the second, the fourth and the sixth amorphous silicon layers 46, 48, 50 are made of pure amorphous silicon, The first to the sixth amorphous silicon layers 41, 46, 47, 48, 49, 50 are polycrystallized by an annealing treatment at temperatures ranging from about 550° to about 700° C. with the aim of diffusing the impurities into the doped silicon layers 41, 47, 49. As a result, corresponding polysilicon layers 41', 46', 47', 48', 49', 50', as indicated in FIG. 2C, are obtained. A thick oxide pattern 42 is formed in a structure of cube or cylinder on the sixth polysilicon layer 50' above the contact hole 40, using the same mask that is used to form the contact hole 40.

Subsequently, with reference to FIG. 2C, on the resulting structure of FIG. 2B, there is formed a nitride layer that is thicker than the oxide pattern 42 and, which is subjected to anisotropic etch, to form a nitride spacer 51 at the side wall of the oxide pattern 42. Using the nitride spacer 51 and oxide pattern 42 as a mask, the sixth through the third polysilicon layers 50', 49', 48', 47' are in sequence etched, to expose the second polysilicon layer 46'.

Figure 2D:
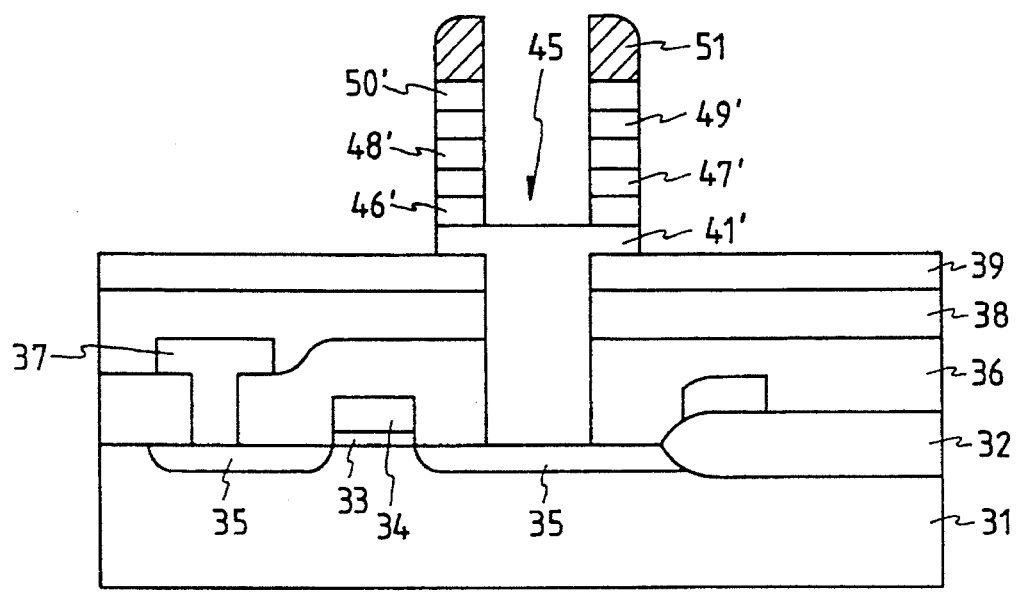

Thereafter, with reference to FIG. 2D, the oxide pattern 42 is eliminated and only then are the remaining polysilicon layers etched with the nitride spacer 51 serving as a mask. During this etch, the sixth through the second polysilicon layers 50', 49', 48' 47', 46' are taken off in the inside of the nitride spacer 51 whereas the second and the first polysilicon layers 46', 41' are taken off in the outside of the nitride spacer 51. As a result, the first polysilicon layer 41' filling the storage electrode contact hole 40 has a cross section of T-shape and a cylindrical storage electrode 45 is formed coming into electrical contact with the first polysilicon layer 41'.

Figure 2E:
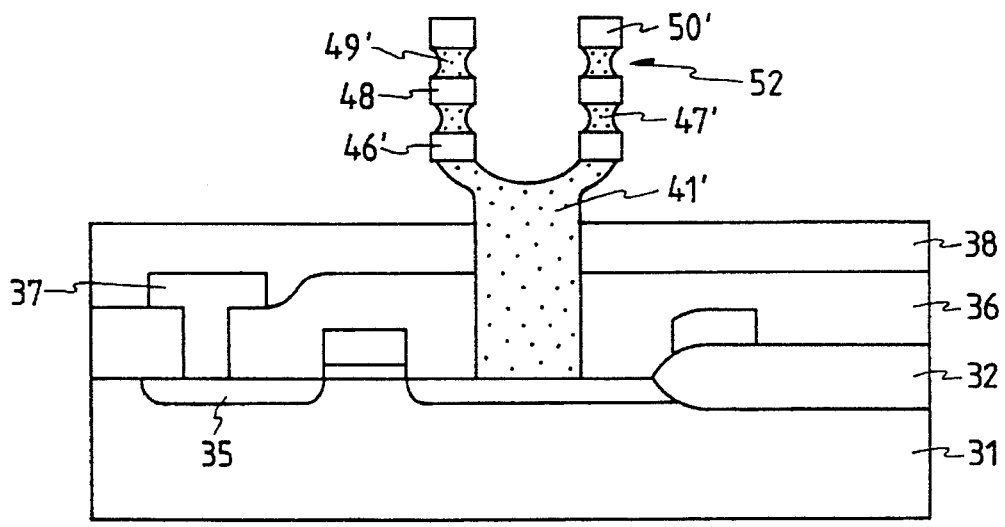

Finally, with reference to FIG. 2E, the nitride spacer 51 is eliminated by wet etch and then, the resulting structure is treated with a chemical etchant containing nitric acid, to form grooves 52 in the wall of the cylindrical storage electrode 45 as well as to eliminate the oxide layer 39.

In accordance with the present invention, the chemical etchant is a solution consisting of nitric acid, acetic acid, hydrofluoric acid and deionized water with a volume ratio of nitric acid: acetic acid: hydrofluoric acid: deionized water being 30:3:0.5:15.5.

The formation of the grooves 52 is accomplished by virtue of difference of etch selectivity between the doped polysilicon and the undoped polysilicon. That is to say, the doped first, third, and fifth polysilicon layers 41', 47', 49' are etched more rapidly than the undoped second, fourth and sixth polysilicon layers 46', 48', 50' are. Accordingly, the surface area of the storage electrode 45 becomes increased as more of the grooves 52 are formed.

As described hereinbefore, the present invention is distinguished by the characteristic fabrication process of a capacitor consisting broadly of laminating an impurity-doped amorphous layer and a pure amorphous layer, alternately and in at least two folds, annealing the multiplicate amorphous layer to polycrystallize it and to diffuse the impurities, utilizing an oxide pattern and a nitride spacer formed at the sidewall of the oxide pattern to form a cylindrical storage electrode consisting of the resulting polysilicon layers, and taking advantage of etch selectivity difference between the doped and undoped polysilicon layers to form grooves in the cylindrical storage electrode. Such storage electrode according to the present invention has a larger surface area than conventional storage electrodes do, in the same space occupied. Therefore, the present invention brings about the effects that high integration of a semiconductor device can be accomplished and the reliability of device operation can be improved.

Other features, advantages and embodiments of the invention disclosed herein will be readily apparent to those exercising ordinary skill after reading the foregoing disclosures. In this regard, while specific embodiments of the invention have been described in considerable detail, variations and modifications of these embodiments can be effected without departing from the spirit and scope of the invention as described and claimed.

What is claimed is:

1. A process of the fabrication of capacitor of a semiconductor device, comprising the steps of:

forming a MOS transistor on a semiconductor substrate;

forming an insulation layer for planarization over the MOS transistor;

forming an oxide layer on the insulation layer for planarization;

forming a contact hole, to expose a source region of the transistor therethrough;

forming a doped first amorphous silicon layer to contact the source region;

forming an undoped second amorphous silicon layer, a doped third amorphous silicon layer, an undoped fourth amorphous silicon layer, a doped fifth amorphous silicon layer, and an undoped sixth amorphous silicon layer on the doped first amorphous silicon layer, in sequence;

annealing the first through the sixth amorphous silicon layers, to polycrystallize them into a first through a sixth polysilicon layers, respectively;

forming an insulation layer pattern on the sixth polysilicon layer such that the insulation layer pattern overlaps with the contact hole;

forming a spacer at a sidewall of the insulation layer pattern;

etching the sixth through the third polysilicon layers with the spacer and insulation layer pattern serving as a mask;

eliminating the insulation layer pattern;

simultaneously etching the sixth through the second polysilicon layers in the inside of the spacer and the second and the first polysilicon layers in the outside of the spacer to form a cylindrical storage electrode with the spacer serving as a mask;

removing the spacer;

etching the doped first, third and fifth polysilicon layers of the storage electrode with a chemical etchant, to form grooves in the sidewall of the storage electrode, whereby the surface area of the storage electrode can be increased.

2. A process in accordance with claim 1, wherein said spacer is formed from a material which is different in etch selectivity from both said insulation layer pattern and said sixth polysilicon layer.

3. A process in accordance with claim 1, wherein said chemical etchant is a mixed solution of nitric acid, acetic acid, hydrofluoric acid and deionized water with the volume ratio of nitric acid: acetic acid: hydrofluoric acid: deionized water being 30:3:0.5:15.5.

4. A process in accordance with claim 1, wherein said oxide layer formed on the insulation layer for planarization is removed by the same chemical etchant that is used for etching the doped first, third and fifth polysilicon layers of the storage electrode to form grooves in the sidewall of the storage electrode.

5. A process of the fabrication of capacitor of a semiconductor device, comprising the steps of:

forming a MOS transistor on a semiconductor substrate;

forming an insulation layer for planarization over the MOS transistor;

forming an oxide layer on the insulation layer for planarization;

forming a contact hole, to expose a source region of the transistor therethrough;

forming a doped first amorphous silicon layer to contact the source region;

forming an undoped second amorphous silicon layer, a doped third amorphous silicon layer and an undoped fourth amorphous silicon layer on the doped first amorphous silicon layer, in sequence;

annealing the first through the fourth amorphous silicon layers, to polycrystallize them into a first through a fourth polysilicon layers, respectively;

forming an insulation layer pattern on the fourth polysilicon layer such that the insulation layer pattern overlaps with the contact hole;

forming a spacer at a sidewall of the insulation layer pattern;

etching the fourth and the third polysilicon layers with the spacer and insulation layer pattern serving as a mask;

eliminating the insulation layer pattern;

simultaneously etching the fourth through the second polysilicon layers in the inside of the spacer and the second and the first polysilicon layers in the outside of the spacer to form a cylindrical storage electrode with the spacer serving as a mask;

removing the spacer;

etching the doped first and third polysilicon layers of the storage electrode with a chemical etchant, to form grooves in the sidewall of the storage electrode, whereby the surface area of the storage electrode can be increased.

6. A process in accordance with claim 5, wherein said spacer is formed from a material which is different in etch selectivity from both said insulation layer pattern and said fourth polysilicon layer.

7. A process in accordance with claim 5, wherein said chemical etchant is a mixed solution of nitric acid, acetic acid, hydrofluoric acid and deionized water with the volume ratio of nitric acid: acetic acid: hydrofluoric acid: deionized water being 30:3:0.5:15.5.

8. A process in accordance with claim 7, wherein said oxide layer formed on the insulation layer for planarization is removed by the same chemical etchant that is used for etching the doped first and third polysilicon layers of the storage electrode to form grooves in the sidewall of the storage electrode.

9. A process in accordance with claim 8, wherein said first through said fourth amorphous layers are annealed at a temperature of about 550° to about 700° C.

* * * * *

UNITED STATES PATENT AND TRADEMARK OFFICE
CERTIFICATE OF CORRECTION

PATENT NO. : 5,478,769

DATED : December 26, 1995

INVENTOR(S) : Chan Lim

It is certified that error appears in the above-identified patent and that said Letters Patent is hereby corrected as shown below:

On the title page: Item [54] and column 1, line 1, replace "STASHED" with --STACKED--

Signed and Sealed this

Twenty-second Day of July, 1997

*Attest:*

*Attesting Officer*

BRUCE LEHMAN

*Commissioner of Patents and Trademarks*